United States Patent [19]
Ahmed

[11] 3,846,696

[45] Nov. 5, 1974

[54] CURRENT ATTENUATOR

[75] Inventor: Adel Abdel Aziz Ahmed, Annandale, N.J.

[73] Assignee: RCA Corporation, New York, N.Y.

[22] Filed: July 20, 1973

[21] Appl. No.: 381,176

[52] U.S. Cl......................... 323/1, 307/321, 323/40, 323/75 F, 330/40

[51] Int. Cl............................................... G05f 3/14

[58] Field of Search........ 307/296, 297, 321; 323/1, 323/4, 40, 75 F; 328/160; 330/22, 30 D, 38 M, 40

[56] References Cited

UNITED STATES PATENTS

| | | | |
|---|---|---|---|
| 3,271,660 | 9/1966 | Hilbiber | 323/75 F |
| 3,277,385 | 10/1966 | Matsumoto | 330/40 X |
| 3,551,836 | 12/1970 | Greeson | 323/1 UX |
| 3,622,897 | 11/1971 | Tsugita | 330/40 X |
| 3,648,153 | 3/1972 | Graf | 323/1 |
| 3,740,658 | 6/1973 | Loving | 330/22 X |

*Primary Examiner*—A. D. Pellinen
*Attorney, Agent, or Firm*—H. Christoffersen; S. Cohen

[57] ABSTRACT

A relatively small collector current flows in a junction transistor having its base and emitter electrode connected to a common terminal by first and second pluralities of serially connected semiconductor junctions, respectively, the first plurality of semiconductor junctions being arranged to be forward biased by a first current and the second plurality of semiconductor junctions arranged to be forward biased by a second current proportional to the first current. Such semiconductor junctions may comprise, for example, diode-connected transistors.

15 Claims, 13 Drawing Figures

CURRENT ATTENUATOR

The present invention relates to circuits, each of which develops a relatively small current compared to those flowing in its other portions, which circuits are, for example, useful in integrated circuitry to permit the use of lower-resistance current determining elements.

In integrated circuitry, singly-diffused resistors, formed in concurrent diffusion with the base regions of NPN transistors, are usually limited to resistance values of a few kilohms to keep the area which they take up within the integrated circuit within reasonable bounds. A doubly-diffused resistor ("pinch" resistor) can provide resistances of tens of kilohms in the same area as a singly-diffused resistor having a value of kilohms. However, the resistance of a doubly-diffused resistor can not be controlled to as close a tolerance as the resistance of a singly-diffused resistor. It becomes desirable, then, to provide currents within the integrated circuit which are small relative to the potentials and resistances used to determine them.

In the prior art, a relatively small collector current has been caused to flow in a transistor which has its base-emitter circuit biased by the offset potential from a forward-biased semiconductor junction. The collector current can be caused to be small as compared to the bias current flowing in the semiconductor junction by proportioning the area of the semiconductor junction used to bias the transistor to be several times as large as the area of the base-emitter junction of the transistor, but it has been found that this method requires excessively large area semiconductor junctions to reduce the transistor collector current to a small fraction of the bias current. Alternatively, instead of using a very large semiconductor junction to establish base-emitter bias potential for the transistor, the transistor may be provided an emitter degeneration resistor. However, in such a circuit, the proportioning of the transistor collector current to the bias current is strongly affected by the level of these currents, which in many applications is undesirable.

An aspect of the present invention is the concept of bias networks using semiconductor junctions connected in series-parallel combination to provide potentials which vary inversely with temperature, and which can therefore be used to scale up or scale down the collector currents of the transistor by fixed proportions. These biasing networks are intermediate circuits useful in themselves as well as in understanding the operation of embodiments of other aspects of the present invention.

A further aspect of the present invention is the development of relatively small collector current from a junction transistor having its base and emitter electrodes biased from first and second potential sources, respectively, each of which potential sources is referenced to the same reference potential and is characterized by being proportional to the offset potential across one or more semiconductor junctions.

In the drawing:

FIG. 1 is a schematic diagram of a biasing network embodying an aspect of the present invention and providing potentials proportional to the difference between offset potentials developed across semiconductor junctions, FIG. 2 is a diagram of the equivalence between a semiconductor junction and a transistor having its base electrode coupled to its collector electrode, known in the prior art but helpful in understanding the present invention;

FIG. 3 is a schematic diagram of a biasing network embodying an aspect of the present invention and serving as a basis for the explanation of circuits according to other aspects of the present invention;

FIGS. 4, 5, and 6 are schematic diagrams of steps used in evolving the current attenuator of FIG. 7 from the biasing network of FIG. 3;

In the ensuing explanations of the present invention, the semiconductor devices are assumed all to be at substantially the same temperatures. Forward-biased semiconductor junctions in the devices are assumed to be formed with substantially identical diffusion or ion-implementation profiles. These assumptions closely describe the conditions to be found within monolithic integrated circuitry, for instance. Departures from these assumptions are possible, and in such case at least some departures from the results hereinbelow described are to be expected, which departures can at least in part be predicted according to known physical laws.

Figure 1:
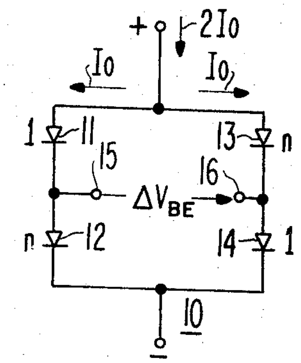

FIG. 1 shows a simple network 10 for obtaining potentials which are the difference between the offset potentials across two semiconductor junctions which have different densities of current through them. A current 2 $I_0$ applied between the positive (+) and negative (−) terminals of the circuit will divide equally between the left and the right branches of the circuit. This condition is necessary under Ohm's Law because (1) the same potential appears across both the left and the right branches and (2) each branch presents the same impedance, being comprised of a semiconductor junction having a given unit area 1 in series with another semiconductor junction having a given unit area $n$ times as large as the unit area. Junctions 11 and 14 are shown with a 1 beside them signifying that their effective junction areas are denominated as being of unit area. Junctions 12 and 13 are shown with an $n$ beside them, signifying that these devices each has an effective junction area $n$ times as large as that of junction 11 or 14.

Figure 2:
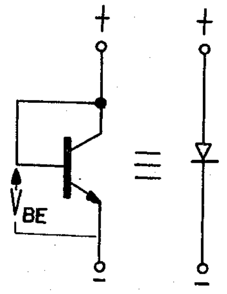
FIG. 2 (PRIOR ART)

While the semiconductor junctions 11, 12, 13 and 14 may be simple PN junctions, they may also be transistors each having its base-electrode direct coupled to its collector electrode. This equivalency for the case of an NPN transistor is illustrated by FIG. 2. Such diode-connected NPN transistors are commonly used as diode rectifiers in monolithic integrated circuitry. In the diode-connected transistor, the base-emitter junction of the transistor controls the rectifying non-linear resistance of the device as exhibited between its collector and emitter electrodes. The effective area of the base-emitter junctions of two transistors determines their relative collector-to-emitter conductances. In the ensuing explanation, the diode rectifier symbol will be presumed to stand for this transistor connection as well as for a simple PN junction, although circuits employing other types of semiconductor junctions may embody the present invention.

The offset potential across the diode-connected transistor will be equal to its base-emitter potential ($V_{BE}$). For current levels small enough that the emitter resistance of the transistor due to its junction predominates over ohmic contact and emitter bulk resistances, the diode-connected transistor action is analogous to that of a simple PN junction. The following well-known relationship obtains between the offset potential ($V_{BE}$) of the diode and the current density ($J_e$) through the diode.

$$V_{BE} = kT/q \, (\ln) \, J_e/J_s \quad (1)$$

where:

$J_e$ is identifiable as emitter current density for a diode connected transistor, $k$ is Boltzmann's constant, $T$ is absolute temperature, $q$ is the charge on an electron, and $J_s$ is a saturation current density term, which displays a dependence upon temperature but is substantially the same for semiconductor devices having the same junction profile.

Now, referring back to the FIG. 1 network, the same current level $I_0$ flows through semiconductor junctions 12 and 14. This means that the current density through semiconductor junction 14 is $n$ times that through semiconductor junction 12 as the former has $1/n$ times as large an effective junction area as junction 12. Therefore, from equation 1, $$V_{BE12} = kT/q \, (\ln) \, J_{e12}/J_s \quad (2)$$

and $$V_{BE14} = kT/q \, (\ln) \, J_{e14}/J_s = kT/q \, (\ln) \, {}_nJ_{e12}/J_s \quad (3)$$

where:

$V_{BE12}$ is the offset potential across junction 12, $J_{e12}$ is the current density through junction 12, $V_{BE14}$ is the offset potential across junction 14, and $J_{e14}$ is the current density through junction 14.

The difference between $V_{BE14}$ and $V_{BE12}$, $\Delta V_{BE}$, appears between output terminals 15 and 16. That is, $$\Delta V_{BE} = V_{BE14} - V_{BE12} \quad (4)$$

Substituting from equations 2 and 3, into equation 4, one obtains the following equation, 5:

$$\Delta V_{BE} = kT/q \, \ln n. \quad (5)$$

This $\Delta V_{BE}$ potential can be seen to have useful properties from observing the results obtained by combining equation 5 both additively and subtractively with equation 1. Added to the base-emitter potential otherwise applied to a transistor this $\Delta V_{BE}$ potential will increase the collector current of that transistor $n$-fold--that is, by $n$ times. Subtracted from the base-emitter potential otherwise applied to a transistor, this $\Delta V_{BE}$ potential will decrease the collector current of the transistor $n$-fold--that is, by $n$ times. This latter property should be kept in mind since it underlies the derivation of the current attenuator circuits to be described.

Figure 3:
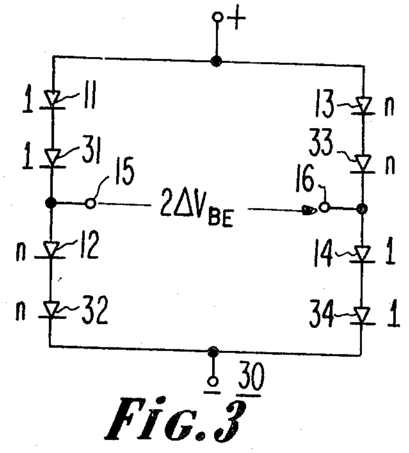

In the FIG. 3 network 30, a 2 $\Delta V_{BE}$ potential is developed between terminals 15 and 16. This modification of the FIG. 1 circuit is made by augmenting each of junctions 11, 12, 13 and 14 of FIG. 1 with a similar junction in series therewith. Junctions 11, 12, 13 and 14 have serially connected with them junctions 31, 32, 33 and 34, respectively. From equation 5, $$2\Delta V_{BE} = [2 \, kT/q \, (\ln n) = kT/q \, (\ln n^2)] \quad (6)$$

This $2\Delta V_{BE}$ potential added to the base-emitter potential otherwise applied to a transistor will increase its collector current $n^2$ times, or subtracted from the base-emitter potential otherwise applied to a transistor will decrease its collector current $n^2$ times.

This same process can be carried further by augmenting the series connection of junctions 11 and 31 with another junction like them, the series connection of junctions 12 and 32 with another junction like them, the series connection of junctions 13 and 33 with another junction like them, and the series connection of junctions 14 and 34 with another junction like them. This will result in a $3\Delta V_{Be}$ potential being developed between terminals 15 and 16 which when subtracted from the base-emitter potential otherwise applied to a transistor will reduce its collector current by $n^3$ times.

With each of the junctions 11, 12, 13 and 14 replaced with 4 junctions similar to itself and serially connected, a $4\Delta V_{BE}$ potential is developed which can be used to reduce the collector current of a transistor by $n^4$. The way to extend this process to develop any $m \, \Delta V_{BE}$ potential to reduce the collector current of a transistor $n^m$ times should now be apparent, viz: augment each of the junctions 11, 12, 13 and 14 in the original FIG. 1 circuit with *m-l* junctions similar to the original junction and serially connected therewith.

Biasing networks of the sort shown in FIGS. 1 and 3 are useful in and of themselves. The $m\Delta V_{BE}=m(kT/q)\ln n$ potentials one of these networks develops between its output terminals 15 and 16 can, for example, be applied between the base electrodes of emitter-coupled differential amplifier transistors to establish the relative collector currents in each of the differential amplifier transistors. A description of the effects upon emitter-coupled differential amplifier transistors having potentials of the nature of $m\Delta V_{BE} = m(kT/q)\ln n$ applied between their respective base electrodes is to be found in my U.S. Pat. application Ser. No. 365,833 filed June 1, 1973, entitled "FRACTIONAL CURRENT SUPPLY" and assigned, like the present application, to RCA Corporation. The networks shown in FIGS. 1 and 3 are also useful as intermediate steps to understand the operation of circuits shown in the later FIGURES of the drawing.

Figure 4:
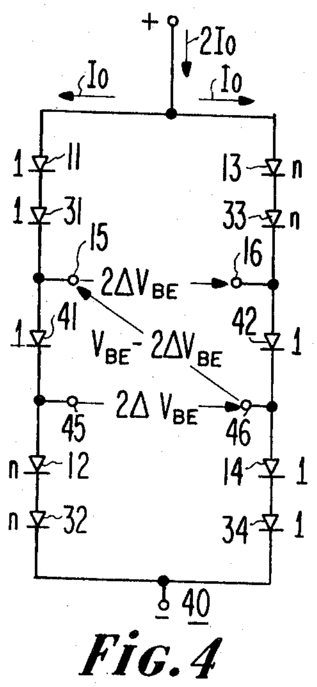

FIG. 4 shows a network 40 in which the FIG. 3 network has been modified by adding a junction 41 to the left branch of circuit 30 and by adding a junction 42 to the right branch of circuit 30. The junctions 41 and 42 have equal junction areas, shown as being unit areas; and each of them has a current $I_0$ flowing therethrough. (The addition of the junctions 41 and 42 to the left and right branches of the circuit introduces equal impedances into each of the branches and so does not affect the splitting of the 2 $I_0$ current into equal halves betweeen them.) Equal potential drops of 1 $V_{BE}$ are developed across each of the junctions 41 and 42 in response to the $I_0$ currents flowing respectively through them.

As before, terminals 15 and 16 have a potential $2\Delta V_{BE}$ developed between them. Terminals 45 and 46 are offset in potential from terminals 15 and 16, respectively, each by an equal $V_{BE}$ offset. Consequently, the terminals 45 and 46 also have a $2\Delta V_{BE}$ potential appearing between them; and a potential $V_{BE}-2\Delta V_{BE}$ is developed between terminals 46 and 15.

Figure 5:
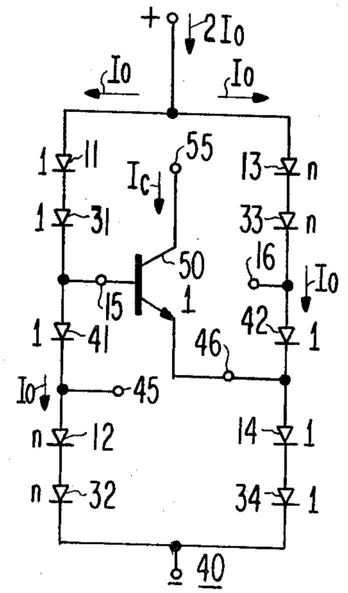

As shown in FIG. 5, this $V_{BE}-2\Delta V_{BE}$ potential may be applied to the base-emitter junction of a transistor having a unit area base-emitter junction. This is shown below to cause the collector current of transistor 50 supplied via terminal 55, to be $n^2$ times smaller than the current $I_0$ flowing in the left or right branches of the circuit 40. Thus, this $I_0$ current is attenuated by this factor--a load (not shown) in the emitter collector path of the transistor 5 will receive a load current equal to $I_0/n^2$.

The potential between terminals 46 and 15, applied to the base-emitter junction of transistor 50, is $2\Delta V_{BE}$ smaller than the $V_{BE}$ potential appearing between terminals 45 and 15 or between terminals 46 and 16. Consequently, the emitter current density in the base-emitter junction of transistor 50 is $1/n^2$ times as large as that in junction 41 or 42. Since the junction areas of the forward biased junctions of devices 41, 42 and 50 are alike, and as devices 41 and 42 carry a current at a level $I_0$, the emitter current of transistor 50 must be $1/n^2$ smaller than $I_0$. In other words, as the current density from the collector through the base-emitter junction of transistor 50 is $1/n^2$ times, that through junctions 41 and 42, and as these junctions are all of the same area, the collector-emitter current of transistor 50 is $I_0/n^2$. The emitter current of a transistor is equal to the sum of its base and collector currents in magnitude, and in a transistor with substantial common-emitter forward current gain ($h_{fe}$) the base current is negligible in comparison to the collector current. Consequently, the collector current of transistor 50 may be presumed substantially equal to its emitter current $I_0/n^2$. The base and emitter currents of transistor 50 are small compared to the currents $I_0$ flowing in the left and right branches of the circuit 40 and therefore do not substantially affect the flow of the $I_0$ currents in the branches.

Figure 6:
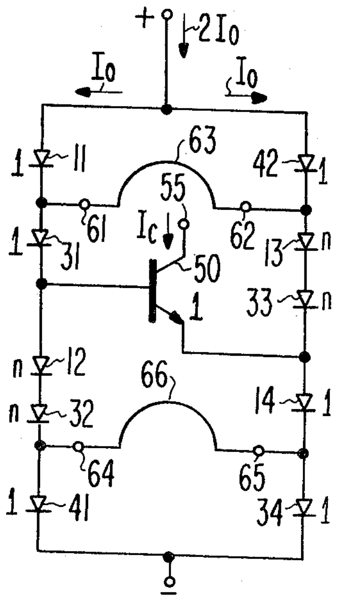

FIG. 6 shows a rearrangement of the FIG. 5 circuit. The junctions in the left and the right branches of the biasing network have been rearranged in their respective series connections so that unit area junctions appear at the extremities of each of the branches. Since a current $I_0$ flows in each of the left and right branches of the biasing network, equal potential drops will appear across each of the junctions 11 and 42 and across each of the junctions 41 and 34. Accordingly, terminals 61 and 62 can be bridged by a connection 63 without affecting current flows in the FIG. 6 biasing network. Similarly, the terminals 64 and 65 can be bridged by an interconnection 66 without affecting current flows in the biasing network.

The parallelled junctions 11 and 42, each having unit junction areas, may be replaced by a direct connection and so can parallelled junctions 41 and 34, each having unit junction area. This will not affect the current flows in the remaining elements 12, 13, 14, 31, 32, 33 and 50. The $2I_0$ current applied to the positive (+) and negative (−) terminals of the network is determined by external means (not shown). The division of this $2I_0$ current between the remaining elements 12, 13, 14, 31, 32, 33 and 50 is determined by the interactions between them and is independent of the division of the $2I_0$ current in other portions of the circuit serially connected with them.

Figure 7:
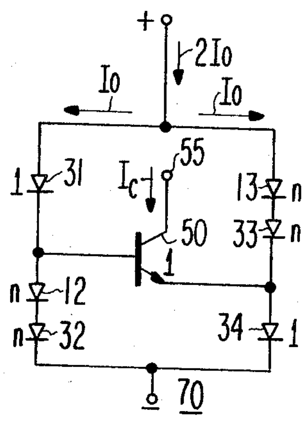
FIGS. 7 and 8 are schematic diagrams of current attenuators embodying the present invention.

FIG. 7 shows the current attenuator circuit 70 which results when these replacements are made. This circuit requires a collector current $I_c$ to flow through terminal 55 for transistor 50 in response to the $2I_0$ current applied between the positive (+) and negative (−) terminals of the circuit. When $n$ is chosen quite large, the current $I_c$ can be made to be substantially smaller than the current $2I_0$. For example, if $n$ is chosen to equal 10 the current $I_c$, which is $n^2$ times smaller than the current $I_0$, would be two-hundredth as large as the current $2I_0$.

Figure 8:
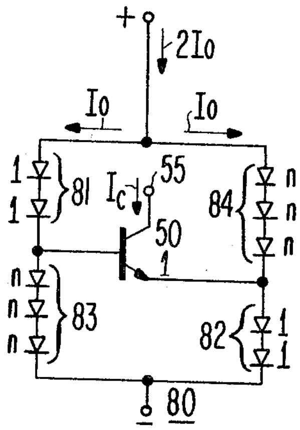

By analogy to the FIG. 7 current attenuator circuit 70, current attenuator circuits in which $I_c$ is an even smaller fraction of the current $2I_0$ can be developed. For example, FIG. 8 shows a circuit 80 in which the current $I_c$ is made to be $n^3$ times as small as the branch current $I_0$. Referring to circuit 80, one may express the general rule of design for this type of circuit in the following way. Where the number of junctions in each of the series connections 81 and 82 equals $m$-1 ($m$-1specifically shown as equalling 2) and the number of junctions in each of the series connections 83 and 84 equals $m$ ($m$ specifically shown as equalling 3), the collector current $I_c$ of transistor 50 will equal $I_0/n^m$.

Figure 9:
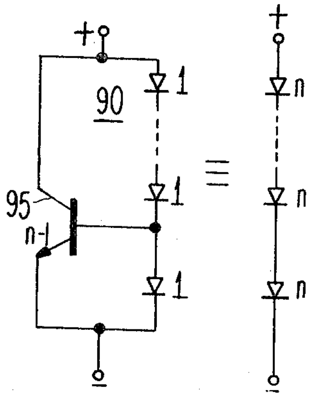
FIG. 9 (PRIOR ART)
FIG. 9 is a diagram showing equivalent circuitry which was known from the prior art, which may be used to replace portions of the circuitry shown in FIGS. 3, 7 and 8.

Generally speaking, it is best to design with higher $m$ and $n$ a small integral multiple of unity--say, 3 or 4. Such design can reduce the total junction area required in terms of unit junction area, especially of one employs the equivalent circuit 90 shown in FIG. 9 to replace the series connection $n$-area junctions. The transistor 95, having a base-emitter junction area of $n$-1 units and receiving base-emitter biasing from a potential divider comprising $m$ serially connected unit area junctions, is a known equivalent circuit for $m$ serially connected $n$-area junctions. The circuit 90 requires a total junction area of $m+n-1$ units as compared to the $mn$ units of the simple series connection of $n$-area junctions. The reduction in total junction area of the current attenuator circuits is desirable because it permits closer packing of the elements in an integrated circuit, which results in improved matching of the thermal conditions of the devices. Making $n$ an integral multiple of unity permits the use of $n$ parallelled unit-area devices to provide an $n$-area device and simplifies matching of the $n$-area device conductance to that of a unity-area device.

Considering the FIG. 8 current attenuator 80 again, if equal currents $I_0$ flow in the left and the right branches of the network, the current base-emitter offset potential for biasing transistor 50 to have the desired collector current $I_c$ can be shown to be provided by either of:

1. the difference of the offset potentials provided by diodes in the series connections 81 and 84, respectively, as referred to the potential at the positive(+) terminal or 2. the difference of the offset potentials provided by the diodes in the series connections 82 and 83, respectively, as referred to the potential at the negative (−) terminal. The use of both the series connections 81 and 84 of diodes and the series connections 82 and 83 of diodes is done to split the current $2I_0$ applied to the positive (+) and the negative (−) terminals of the current attenuator 70 and the equal currents $I_0$ in the left and the right branches of the network.

Figure 10:
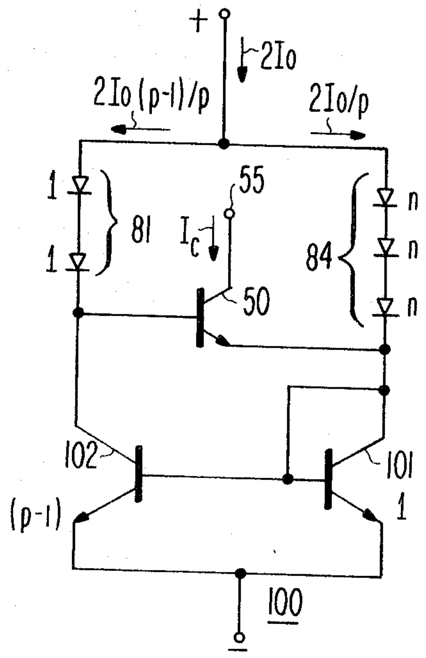
FIGS. 10 and 11 show current attenuators providing similar attenuation to the current attenuator of FIG. 9 but emphasizing different aspects of the present invention.

FIG. 10 shows a current attenuator 100. Assume transistors 101 and 102 therein to be matched. The base-emitter potential of transistor 101, developed in response to its collector-to-base feedback connection constraining its collector current to some fraction of $2I_0$, is applied to the base-emitter junction of similar transistor 102 to cause a collector current therein substantially equal to the collector current of transistor 101. Essentially equal fractions of the $2I_0$ current must flow as collector currents to each of the transistors 101 and 102, so each collector current must be substantially $I_0$ in value. The relationship between the current $I_c$ and the current $2I_0$, assuming transistors 101 and 102 to be matched, is the same in current attenuator 100 as in current attenuator 70 (FIG. 7).

More generally, one may assume the effective area of the base-emitter junction of transistor 102 to be $(p\text{-}1)$ times as large as that of the transistor 101. In such case, the base-emitter potential $V_{BE50}$ of transistor 50 can be expressed as the difference of the potential drops across diode connections 81 and 84.

$$V_{BE} = mkT/q\ (1n)\ 2I_0/p/nI_s - (m\text{-}1)kT/q\ (1n)\ (p\text{-}1)2I_0/p/I_s \quad (7)$$

Substituting the following equation 8 into equation 7, one obtains equations 9 expressing the relation of $I_c$ to $2I_0$ $$V_{BE50} = kT/q\ (1n)\ I_c/I_s \quad (8)$$

$$I_c = 2I_0/p\ (p\text{-}1)^{(m-1)}n^m \quad (9)$$

The emitter current of transistor 50 is substantially equal to its collector current $I_c$, but is so small compared to the current $2I_0$/p flowing in the right branch of the circuit as to negligible in comparison. The even smaller base current of transistor 50 will be negligible compared to the current $2I_0(p\text{-}1)$/p flowing in the left branch of the circuits. Therefore, neglecting the base and emitter currents of transistor 50 in determining its base-emitter potential, as was done just above, is justified. For $p$=2, the condition where the effective areas of base-emitter junctions of transistors 101 and 102 are equal, the equation 9 relationship reduces to:

$$I_c = 2I_0/n^m \quad (10)$$

the result previously set for the current amplifiers 70, 80. Larger values of $p$ will permit lower values of $I_c$ to be obtained for a given amount of total device area.

Figure 11:
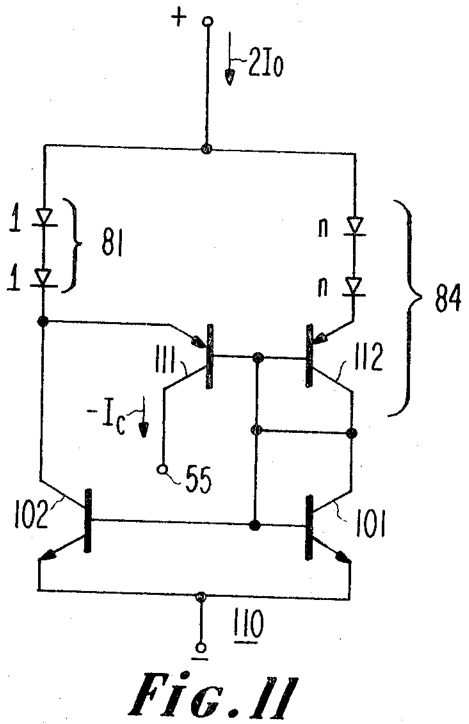

FIG. 11 shows a current attenuator 110 similar to current amplifier 100, except the base-emitter junction of a PNP transistor 111 is biased for low collector current rather than the NPN transistor 50. A diode-connected PNP transistor 112 provides one of the diodes in connection 84. If its base-emitter junction has an effective area $n$ times as large as that of transistor 111 the magnitude of the collector current of transistor 111 with respect to $2I_0$ in the FIG. 11 configuration is the same as that of transistor 50 in the FIG. 10 configuration. In some applications, it may be more practical to make transistors 111 and 112 with matched geometry. In such a case, it can be shown that $-I_c$ will not be as small, by a factor $n$, as in the previously discussed case.

Other types of current amplifiers may replace the current amplifier provided by transistors 101 and 102 in either of the current attenuators 100 or 110. The base electrodes of transistors 101 and 102 need not be biased from the collector electrode of transistor 101. Rather, the base-emitter circuits of transistors 101 and 102 may be biased by ancillary means. The emitter electrodes of transistors 101 and 102 may be provided emitter degeneration resistors.

Also, the transistors 101 and 102 may be dispensed with and their collector-to-emitter paths replaced in either of the FIG. 10 and FIG. 11 configurations by resistive elements. For instance, a configuration may be employed similar to that shown in FIG. 8 but in which two equal resistance resistors are used, one replacing the serial connection 82 of diodes and the other being serially connected with a diode which serial connection replaces the serial connection 83 of diodes. Similarly, a configuration like that of FIG. 8 can be modified using two equal value resistors, one to replace the serial connection 81 of diodes and the other serially connected with a diode to replace serial connection 84 of diodes.

Figure 12:
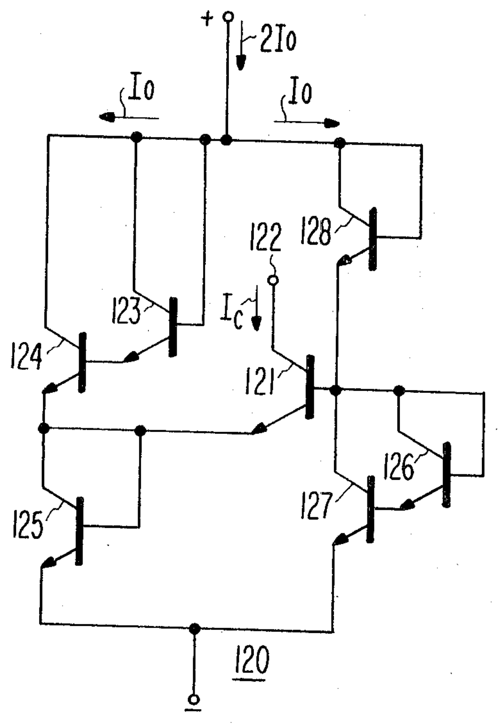
FIGS. 12 and 13 show current attenuators embodying the present invention to provide beta-related currents, where beta is the common-emitter forward current gain of a transistor.
Figure 13:
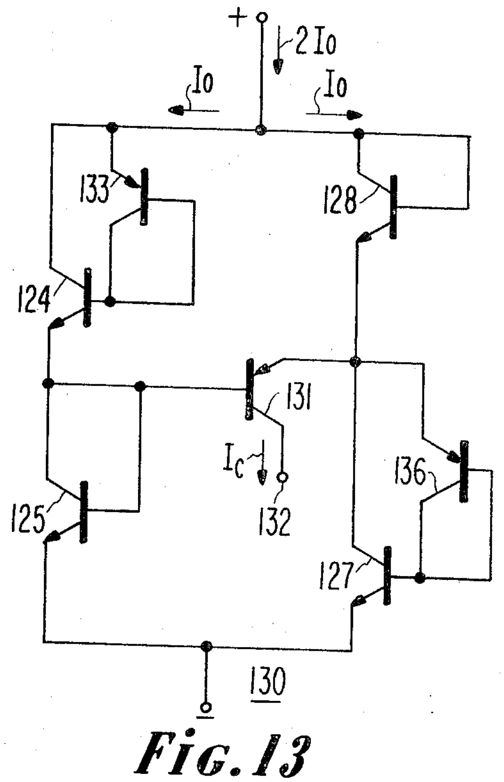

FIGS. 12 and 13 show current attenuator circuits 120 and 130, respectively, in each of which the output current $I_c$ is smaller than the $2I_0$ input current, but is not a fixed fraction thereof. Rather, $I_c$, in substance, is $I_0$ divided by the common-emitter forward current gain of certain transistors used in the current attenuator circuit.

Referring to FIG. 12, a $2I_0$ input current is applied to the positive (+) and the negative (−) terminals of current attenuator circuit 120. Assuming transistors 123, 124 and 125 to be matched to transistors 126, 127, and 128, respectively, the current $2I_0$ divides equally between the left and the right branches of the biasing network for transistor 121, the collector current $I_c$ of which transistor 121 flows through output terminal 122 in response to the $2I_0$ input current. The left branch of the biasing network comprises the series connection of: (1) transistor 123 and 124 connected in Darlington diode configuration and (2) diode-connected transistor 125. Similarly, the right branch of the biasing network comprises the series connection of: (1) transistors 126 and 127 connected in Darlington diode configuration and (2) diode-connected transistor 128. So long as the base and emitter currents of transistors 121 are substantially smaller than the currents in the branches of its biasing network--which indeed is the case--the left and right branches of the biasing network present substantially equal impedances to the flow of current $2I_0$ between the positive (+) and the negative (−) terminals of the circuit 120. This causes the substantially equal splitting of the current $2I_0$ between the two branches.

The relationship between the base-emitter potentials of transistors 121, 125, 126 and 127 ($V_{BE121}$,$V_{BE125}$, $V_{BE126}$, and $V_{BE127}$, respectively) is easily determined for the case where the areas of their base-emitter junctions are all equal in area.

$$V_{BE121} = V_{BE127} + V_{BE126} - V_{BE125}. \quad (11)$$

The transistors 125 and 127 each have an emitter current $I_0$ flowing therein so $V_{BE125}$ equals $V_{BE127}$. Equation 11 consequently reduces to:

$$V_{BE121} = V_{BE126}. \quad (12)$$

Since their $V_{BE}$'s are equal, assuming transistor 121 to be matched to transistors 123 and 126, the emitter current of transistor 121 like that of transistor 126 equals the base current of transistor 127. The collector current $I_c$ of transitor 121 is substantially equal to its emitter current and thus to the base current of transistor 127. This current level is $I_0$, the emitter current level of transistor 127, divided by the common-emitter forward current gain ($h_{fe127}$) of transistor 127 plus unity. In short:

$$I_c \overset{\circ}{=} I_0/h_{fe127}+1 \quad (13)$$

where an equal sign with a circle thereover means "substantially equals." Usually $h_{fe}$ is 40 or more for NPN transistors of conventional construction, so $$I_c \overset{\circ}{=} I_0/h_{fe127} \quad (14)$$

The value of $I_c$ may also be developed by considering in an analagous manner the relationship between the base-emitter potentials of transistors 121, 123, 124 and 128. This results in the following relationship:

$$I_c \overset{\circ}{=} I_0/h_{fe124} +1 \overset{\circ}{=} I_0/h_{fe124} \quad (15)$$

Since $h_{fe124}$ and $h_{fe127}$ are the same, transistors 125 and 127 being matched, the same result obtains either way.

FIG. 13 shows a circuit similar to that of FIG. 12, but in which the diode-connected NPN transistors 123 and 126 have been replaced by diode-connected transistors 133 and 136, respectively, and in which the biasing network establishes the base-emitter potential of a PNP transistor 131 rather than that of an NPN transistor 121. The collector current $I_c$ of transistor 131 flowing via terminal 132 is, as in FIG. 12 circuit, given by equations 11, 12, 13, and 14. Thus, a current essentially inversely proportional to the $h_{fe}$ of an NPN transistor is provided from the collector electrode of a PNP transistor.

One can use the teachings of the present invention to design circuits combining the concepts of current attenuators of the type shown in FIG. 8 with the type shown in FIG. 12 or 13 so as to provide currents which are equal to $I_0$ divided by multiples of the $h_{fe}$ of transistors or by multiples of $h_{fe}$ raised to a power.

In construing the claims "a number of serially connected semiconductor junctions" is to be regarded as descriptive not only of a connection of component elements but of voltage regulators known to have substantially similar operating characteristics. For example, the term is to be assumed descriptive of the voltage regulator circuit 90 shown in FIG. 9 and is used for lack of an alternative widely-accepted, simple and straightforward term to describe this sort of voltage regulator circuit. Using such regulators, the "number of serially connected semiconductor junctions" need not be integral, only positive. Such freedom of design may be desirable, for instance, where the variations with temperature of the potential appearing between the positive and negative terminals of the biasing network is to be used for temperature compensation purposes.

The term "semiconductor junction" in the claims without further specification refers to a simple PN junction, or to the base-emitter junction of a transistor, diode-connected or otherwise.

What is claimed is:

1. A current attenuator comprising:

a first terminal and a second terminal between which an input current may be applied;

a transistor having a base electrode and an emitter electrode and a base-emitter semiconductor junction therebetween and having a collector electrode;

a first number M of semiconductor junctions serially connected from said transistor base electrode to said first terminal;

a second number N of semiconductor junctions serially connected from said transistor emitter electrode, to said first terminal, one of the numbers M and N being one more than the other, each said semiconductor junction in the larger of said first and said second numbers having a higher conductivity on average than the conductivity on average of each semiconductor junction in the smaller of said first and said second numbers;

means responding to said input current flow between said first and said second terminals and splitting it into two portions, namely, first and second currents, each in fixed proportion to the other, said first current being applied between said base electrode and said first terminal and said second current being applied between said emitter electrode and said first terminal; and a third terminal to which said transistor collector electrode is connected for supplying an output current substantially smaller than said first and said second currents.

2. A current attenuator as claimed in claim 1 wherein said means responding to said input current flow between said first and said second terminals and splitting it into two portions comprises:

a third number M of semiconductor junctions serially connected from said second terminal to said transistor emitter electrode and a fourth number N of semiconductor junctions serially connected from said second terminal to said transistor base electrode, each said semiconductor junction in the larger of said third and said fourth numbers having a higher conductivity on average than each said semiconductor junction in the smaller of said third and said fourth numbers.

3. A current attenuator as claimed in claim 1 wherein said means responding to said input current flow between said first and said second terminals and splitting it into two portions includes:

a three-terminal current amplifier having an input terminal and an output terminal connected to separate ones of the base and the emitter electrodes of said first transistor and having a common terminal connected to said second terminal.

4. A current attenuator comprising:

first, a second and third terminals;

first and second and third and fourth and fifth and sixth and seventh transistors, each having a base and an emitter and a collector electrode, each having a base-emitter junction between its said base and emitter electrodes and a collector-to-emitter path between its collector and emitter electrodes, said first and said second and said third and said fourth transistors being matched to each other, said fifth and said sixth transistors being matched to each other, said first transistor emitter electrode and said second transistor collector electrode being connected, said third transistor emitter electrode and said fourth transistor collector electrode being connected, said second and said third and said fifth and said sixth transistors each having its base electrode connected to its collector electrode, said fifth transistor collector-to-emitter path being connected between the collector and base electrodes of said first transistor, said sixth transistor collector-to-emitter path being connected between the collector and base electrodes of said fourth transistor, the collector electrodes of said first and said third transistors being connected to said first terminal, the emitter electrodes of said second and said fourth transistors being connected to said second terminal, the collector electrode of said seventh transistor being connected to said third terminal, and said seventh transistor base emitter junction being connected between the emitter electrodes of said first and said third transistors.

5. A current attenuator as claimed in claim 4 wherein:

said first, said second, said third, said fourth, said fifth, said sixth and said seventh transistors are all of the same conductivity type.

6. A current attenuator as claimed in claim 4 wherein:

said fifth, said sixth and said seventh transistors are of the same conductivity type to each other and of complementary conductivity type to said first, said second, said third and said fourth transistors.

7. In combination:

first, second, third, and fourth terminals;

first and second pluralities of semiconductor junctions, said first and said second pluralities being of equal number to each other and each consisting of a first and a second portion, each semiconductor junction in said first portion of said first and said second pluralities having a higher conductivity on average than the conductivity on average of each semiconductor junction in its respective second portion;

means arranging the semiconductor junctions in said first plurality in a first serial combination such that said first portion thereof connects said first and said second terminals and that said second portion thereof connects said second and third terminals, and means arranging the semiconductor junctions in said second plurality in a second serial combination, such that said first portion thereof connects said fourth and said third terminals, that said second portion thereof connects said first and said fourth terminals and that said first and said second serial combination are in parallel combination with each other for current as may be applied between said first and said third terminals.

8. A combination as claimed in claim 7 including:

a fifth terminal and a junction transistor having base and emitter electrodes connected to said second terminal and to said fourth terminal respectively and having a collector electrode connected to said fifth terminal.

9. An unbalanced bridge consisting solely of semiconductor junctions comprising in combination:

first and second input terminals between which an input current may be applied;

third and fourth terminals serving as output terminals;

first and second bridge arms respectively comprising M and N series connected semiconductor junctions, said first arm connected between the first and third terminals and said second arm connected between the third and second terminals;

a third bridge arm comprising M series connected semiconductor junctions, each junction area p, said third arm connected between said fourth and second terminals; and a fourth bridge arm comprising N series connected semiconductor junctions, each junction of area q, said fourth arm connected between said first and fourth terminals, where M and N are integers, where p differs substantially from q and where all junctions are connected in the forward direction with respect to the flow of said input current.

10. An unbalanced bridge as set forth in claim 9, further including means responsive to the potential developed between said third and fourth terminals in response to input current flow between said first and second terminals, for producing an output current substantially smaller in value than said input current.

11. An unbalanced bridge as set forth in claim 10, wherein said means comprises a transistor having an emitter-base junction and a collector electrode, said emitter-base junction coupled, in the forward direction, between said third and fourth terminals, and a terminal coupled to said collector electrode to which a current may be applied.

12. An unbalanced bridge as set forth in claim 9, wherein the M series connected semiconductor junctions in said first bridge arm are each of area *q* and the N series connected semiconductor junctions in said second bridge arm are each of area p.

13. An unbalanced bridge as set forth in claim 9, wherein M and N are different integers.

14. An unbalanced bridge as set forth in claim 13, wherein N equals M + 1 and a transistor has a base electrode directly connected to said third terminal, and has an emitter electrode directly connected to said fourth terminal and has a collector electrode connected so one output current responsive to said input current can flow therethrough.

15. An unbalanced bridge as set forth in claim 9, wherein each semiconductor junction comprises a transistor connected to operate as a diode.

* * * * *